US011523082B2

(12) United States Patent
Ando et al.

(10) Patent No.: US 11,523,082 B2
(45) Date of Patent: Dec. 6, 2022

(54) IMAGE SENSOR WITH PIXELS HAVING MULTIPLE PATHS FOR TRANSFERRING CHARGE

(71) Applicant: NIKON CORPORATION, Tokyo (JP)

(72) Inventors: Ryoji Ando, Sagamihara (JP); Yoshiyuki Watanabe, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/648,153

(22) PCT Filed: Sep. 27, 2018

(86) PCT No.: PCT/JP2018/036010
§ 371 (c)(1),
(2) Date: Jul. 2, 2020

(87) PCT Pub. No.: WO2019/065866
PCT Pub. Date: Apr. 4, 2019

(65) Prior Publication Data
US 2020/0329208 A1  Oct. 15, 2020

(30) Foreign Application Priority Data
Sep. 29, 2017 (JP) .............................. JP2017-192167

(51) Int. Cl.
*H04N 5/378* (2011.01)
*H01L 27/146* (2006.01)
(Continued)

(52) U.S. Cl.
CPC ....... *H04N 5/378* (2013.01); *H01L 27/14612* (2013.01); *H01L 27/14643* (2013.01);
(Continued)

(58) Field of Classification Search
CPC .. H04N 5/378; H04N 5/37452; H04N 5/3559; H04N 5/3745; H04N 5/3532;
(Continued)

(56) References Cited

U.S. PATENT DOCUMENTS 9,900,481 B2 *  2/2018  Geurts .................. H04N 5/372
10,469,775 B2 * 11/2019  McCarten .......... H04N 5/35581
(Continued)

FOREIGN PATENT DOCUMENTS

JP    2012-084644 A    4/2012
JP    2012-248952 A   12/2012
(Continued)

OTHER PUBLICATIONS

Nov. 20, 2018 International Search Report issued in International Patent Application No. PCT/JP2018/036010.
(Continued)

*Primary Examiner* — Albert H Cutler
(74) *Attorney, Agent, or Firm* — Oliff PLC

(57) ABSTRACT

An image sensor includes: a photoelectric conversion unit that photoelectrically converts light to generate an electric charge; a holding unit that holds the electric charge generated by the photoelectric conversion unit; an accumulation unit that accumulates the electric charge generated by the photoelectric conversion unit; a first transfer path that transfers the electric charge generated by the photoelectric conversion unit to the accumulation unit; and a second transfer path that transfers the electric charge generated by the photoelectric conversion unit to the accumulation unit via the holding unit.

19 Claims, 12 Drawing Sheets

(51) Int. Cl.
*H04N 5/355* (2011.01)
*H04N 5/3745* (2011.01)
*H04N 5/353* (2011.01)

(52) U.S. Cl.
CPC ......... *H04N 5/3559* (2013.01); *H04N 5/3745* (2013.01); *H04N 5/37452* (2013.01)

(58) Field of Classification Search
CPC ......... H01L 27/14612; H01L 27/14643; H01L 27/14609
See application file for complete search history.

(56) References Cited

U.S. PATENT DOCUMENTS

| | | | | |
|---|---|---|---|---|
| 2010/0276574 | A1* | 11/2010 | Manabe | H04N 5/37452 250/214 A |
| 2011/0085066 | A1* | 4/2011 | Sugawa | H04N 5/37452 348/302 |
| 2011/0211103 | A1* | 9/2011 | Sakano | H04N 5/37452 348/308 |
| 2012/0085888 | A1 | 4/2012 | Endo et al. | |
| 2013/0044247 | A1 | 2/2013 | Kawahito et al. | |
| 2013/0126710 | A1 | 5/2013 | Kondo | |
| 2016/0134824 | A1 | 5/2016 | Gomi et al. | |
| 2017/0078604 | A1 | 3/2017 | Kobayashi et al. | |
| 2017/0244921 | A1* | 8/2017 | Velichko | H04N 5/3597 |
| 2017/0350755 | A1* | 12/2017 | Geurts | G01J 1/4228 |
| 2018/0115731 | A1* | 4/2018 | Lee | H04N 5/35581 |

FOREIGN PATENT DOCUMENTS

| | | |
|---|---|---|
| JP | 2013-110449 A | 6/2013 |
| JP | 2017-055322 A | 3/2017 |
| WO | 2011/096340 A1 | 8/2011 |

OTHER PUBLICATIONS

May 25, 2021 Office Action issued in Japanese Patent Application No. 2019-545619.

Oct. 5, 2021 Office Action issued in Japanese Patent Application No. 2019-545619.

Sep. 6, 2022 Office Action issued in Japanese Patent Application No. 2021-210723.

* cited by examiner

IMAGE SENSOR WITH PIXELS HAVING MULTIPLE PATHS FOR TRANSFERRING CHARGE

TECHNICAL FIELD

The present invention relates to an image sensor.

BACKGROUND ART

An image sensor driven in a global electronic shutter mode is known (see PTL1). With such an image sensor, it is difficult to perform signal readout by a rolling electronic shutter mode.

CITATION LIST

Patent Literature

PTL1: Japanese Laid-Open Patent Publication No. 2012-84644

SUMMARY OF INVENTION

Solution to Problem

According to a first aspect of the present invention, an image sensor comprises: a photoelectric conversion unit that photoelectrically converts light to generate an electric charge; a holding unit that holds the electric charge generated by the photoelectric conversion unit; an accumulation unit that accumulates the electric charge generated by the photoelectric conversion unit; a first transfer path that transfers the electric charge generated by the photoelectric conversion unit to the accumulation unit; and a second transfer path that transfers the electric charge generated by the photoelectric conversion unit to the accumulation unit via the holding unit.

According to a second aspect of the present invention, an image sensor comprises: a photoelectric conversion unit that photoelectrically converts light to generate an electric charge; a holding unit that holds the electric charge generated by the photoelectric conversion unit; an accumulation unit that accumulates the electric charge generated by the photoelectric conversion unit; a first transfer unit that transfers the electric charge generated by the photoelectric conversion unit to the accumulation unit; and a second transfer unit that transfers the electric charge held in the holding unit to the accumulation unit.

DESCRIPTION OF EMBODIMENTS

An image sensor according to the present embodiment is configured to be capable of performing an operation in a global electronic shutter mode (hereinafter, a global shutter operation) and an operation in a rolling electronic shutter mode (hereinafter, referred to as a rolling shutter operation). The global shutter operation refers to a driving mode of performing reset of photodiodes included in the image sensor, generation of electric charges in the photodiodes, and the like, simultaneously in all rows (i.e., all pixels). For the global shutter operation, accumulation processes are simultaneous for all rows because the accumulation processes can be simultaneously started for all pixels.

On the other hand, the rolling shutter operation refers to a driving mode of performing reset of photodiodes included in the image sensor, generation of electric charges in the photodiodes, and the like, row by row. For the rolling shutter operation, accumulation processes are not simultaneous for all rows because timings of starting the accumulation processes are different from one row to another, even when accumulation times (electric charge generation times) are the same for all rows.

Details will be described below with reference to the drawings.

Figure 1:
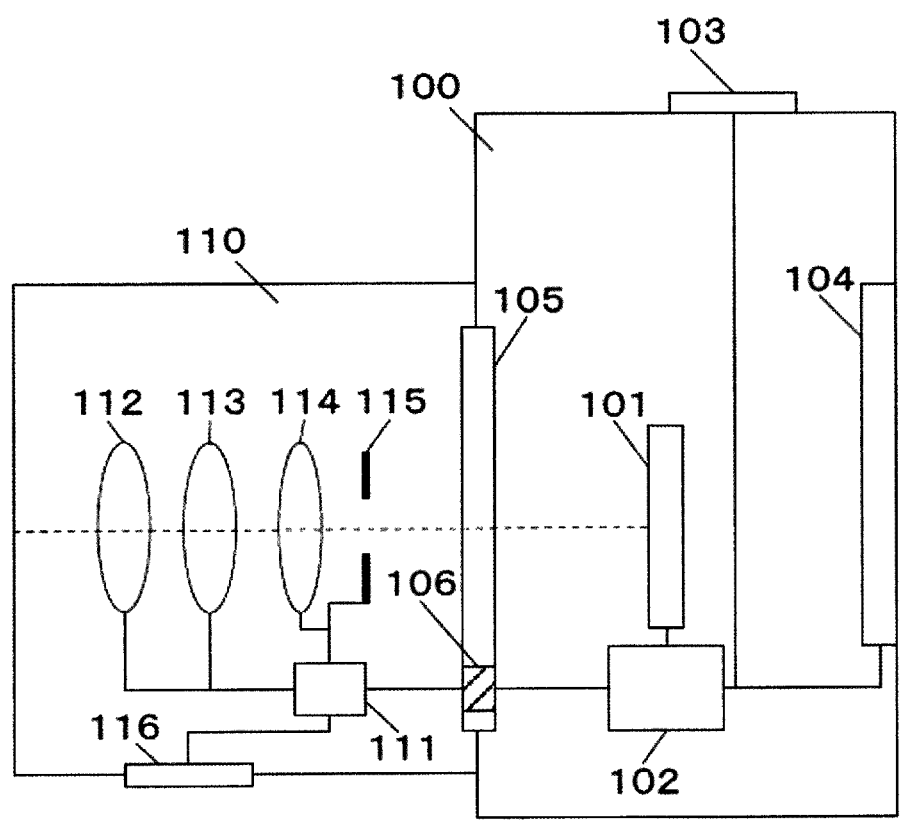
FIG. 1 is a view illustrating a configuration example of a digital camera.

FIG. 1 is a view schematically illustrating a configuration example of a digital camera including an image sensor 101 according to one embodiment. The digital camera includes an interchangeable lens 110 and a camera body 100, and the interchangeable lens 110 is attached to the camera body 100 via a lens mount unit 105.

Note that the digital camera may be a lens-integrated camera, instead of a lens-interchangeable camera.

The interchangeable lens 110 includes, for example, a lens control unit 111, a zoom lens 112, a focus lens 113, an anti-vibration lens 114, an aperture 115, a lens operation unit 116, and the like. The lens control unit 111 includes a CPU and peripheral components such as a memory. The lens control unit 111 performs drive control of the focus lens 113 and the aperture 115, position detection of the zoom lens 112 and the focus lens 113, transmission of lens information to the camera body 100, reception of camera information from the camera body 100, and the like.

The camera body 100 includes, for example, the image sensor 101, a body control unit 102, a body operation unit 103, a display unit 104, and the like. The image sensor 101 is arranged in a predetermined imaging plane (intended focus plane) of the interchangeable lens 110 to photoelectrically convert a subject image formed by the interchangeable lens 110. The body operation unit 103 includes a shutter button, operation members for various settings, and the like. The display unit 104 includes, for example, a liquid crystal monitor (also referred to as a rear monitor) mounted on a rear surface of the camera body 100.

The body control unit 102 includes a CPU and peripheral components such as a memory. The body control unit 102 performs operation control of the digital camera, such as drive control of the image sensor 101, readout of image signals from the image sensor 101, focus detection calculation and focus adjustment of the interchangeable lens 110, and processing and recording of image signals. Further, the body control unit 102 performs communication with the lens control unit 111 via an electric contact 106 provided in the lens mount unit 105 to receive lens information and transmit camera information (a defocus amount, an aperture value, and the like).

A light flux having passed through the interchangeable lens 110 forms a subject image on a light-receiving surface of the image sensor 101. The subject image is photoelectrically converted by the image sensor 101, and a signal resulted from the photoelectric conversion is then transmitted to the body control unit 102.

The body control unit 102 detects a focus adjustment state (defocus amount) of the interchangeable lens 110 by performing a known focus detection calculation based on the signal from the image sensor 101. The defocus amount detected by the body control unit 102 is transmitted to the lens control unit 111.

The lens control unit 111 calculates a drive amount of the focus lens 113 based on the received defocus amount. The lens control unit 111 then drives a motor (not shown) or the like based on the calculated drive amount, to cause the focus lens 113 to be moved to a focus position.

Further, the body control unit 102 processes the signal from the image sensor 101 to generate image data, and stores the image data in a memory card (not shown). The body control unit 102 further causes the display unit 104 to display a monitor image (also referred to as a live view image) based on the signal from the image sensor 101.

Configuration of Image Sensor

Figure 2:
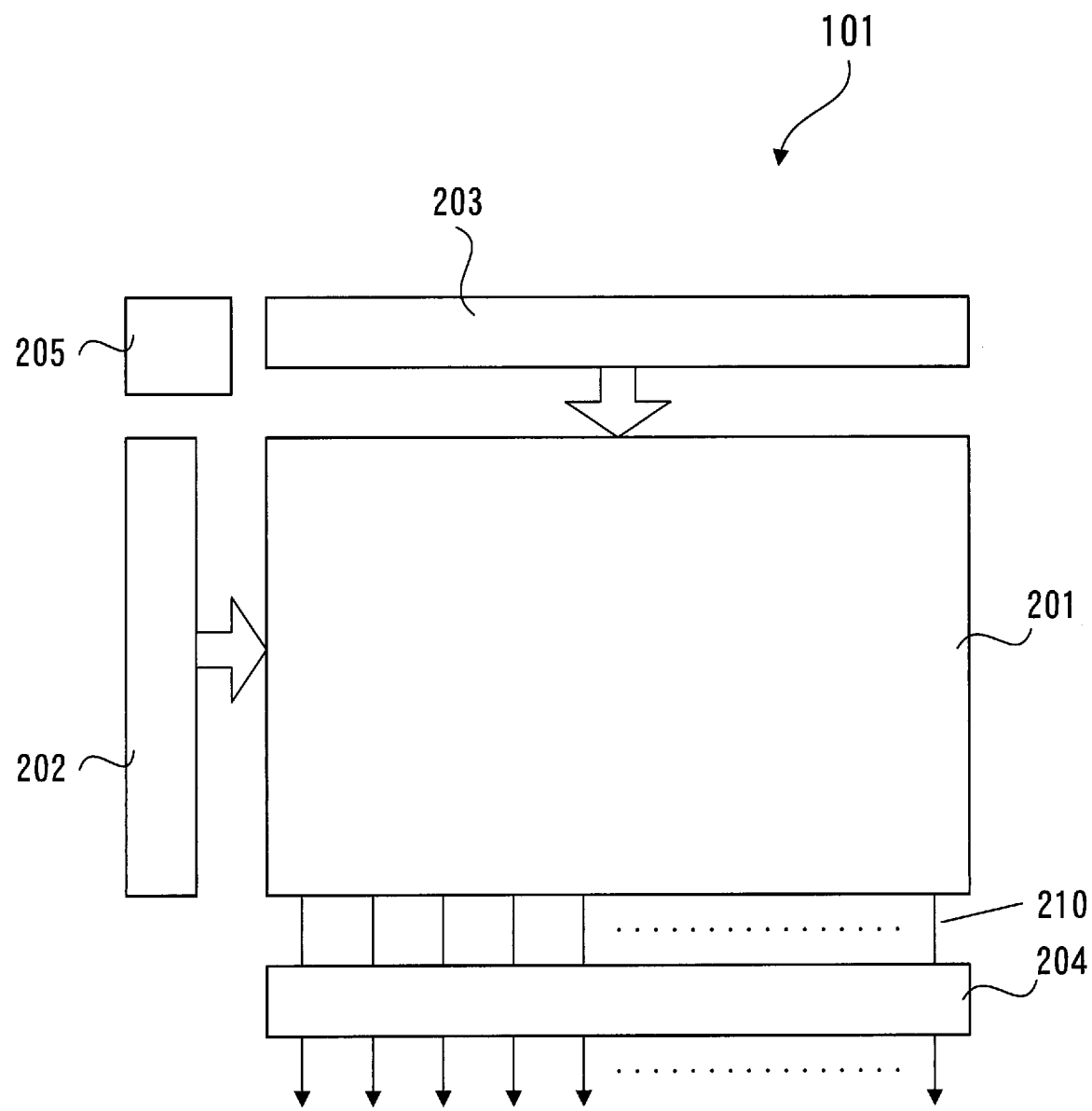
FIG. 2 is a view illustrating an outline of an image sensor.

FIG. 2 is a schematic view illustrating an outline of the image sensor 101. The image sensor 101 is a CMOS image sensor. The image sensor 101 includes a pixel area 201, a vertical control unit 202, a horizontal control unit 203, an output unit 204, and a control unit 205. Note that a power supply unit and a detailed circuit diagram are omitted in FIG. 2.

The pixel area 201 has a plurality of pixels arranged two-dimensionally in a horizontal direction (row direction) and a vertical direction (column direction), for example. Each pixel has a photodiode (photoelectric conversion unit) that generates an electric charge in accordance with an incident light amount. Each of the plurality of pixels is driven by the vertical control unit 202 and the horizontal control unit 203, and a signal based on the electric charge generated in the photodiode of each pixel is read out via a vertical signal line 210.

The output unit 204 performs a correlated double sampling (CDS) on the signal read out from each pixel and applies a gain on the signal, as necessary. The signal processed by the output unit 204 is output to a signal processing unit (not shown) located downstream.

In the above description, an example has been described in which the output unit 204 outputs signals as analog signals to the signal processing unit located downstream. However, the output unit 204 may include an A/D converter to output signals after A/D conversion as digital signals.

Further, an example is illustrated in which the output unit 204 outputs signals read out via the vertical signal lines 210 to the signal processing unit located downstream, in parallel. However, signals may be output to the signal processing unit located downstream, one by one, after a horizontal transfer in the output unit 204.

The control unit 205 controls the elements of the image sensor 101 described above. That is, a global shutter operation and a rolling shutter operation of the image sensor 101 described below are performed under the control of the control unit 205 in response to commands from the body control unit 102.

Note that in the present embodiment, a "pixel" includes a photodiode and a readout unit that reads out a signal based on an electric charge generated in the photodiode. An example will be illustrated in which the readout unit includes transfer transistors, a floating diffusion (FD) region, an amplification transistor, and a selection transistor as described later. However, the readout unit is not limited to the present example.

Figure 3:
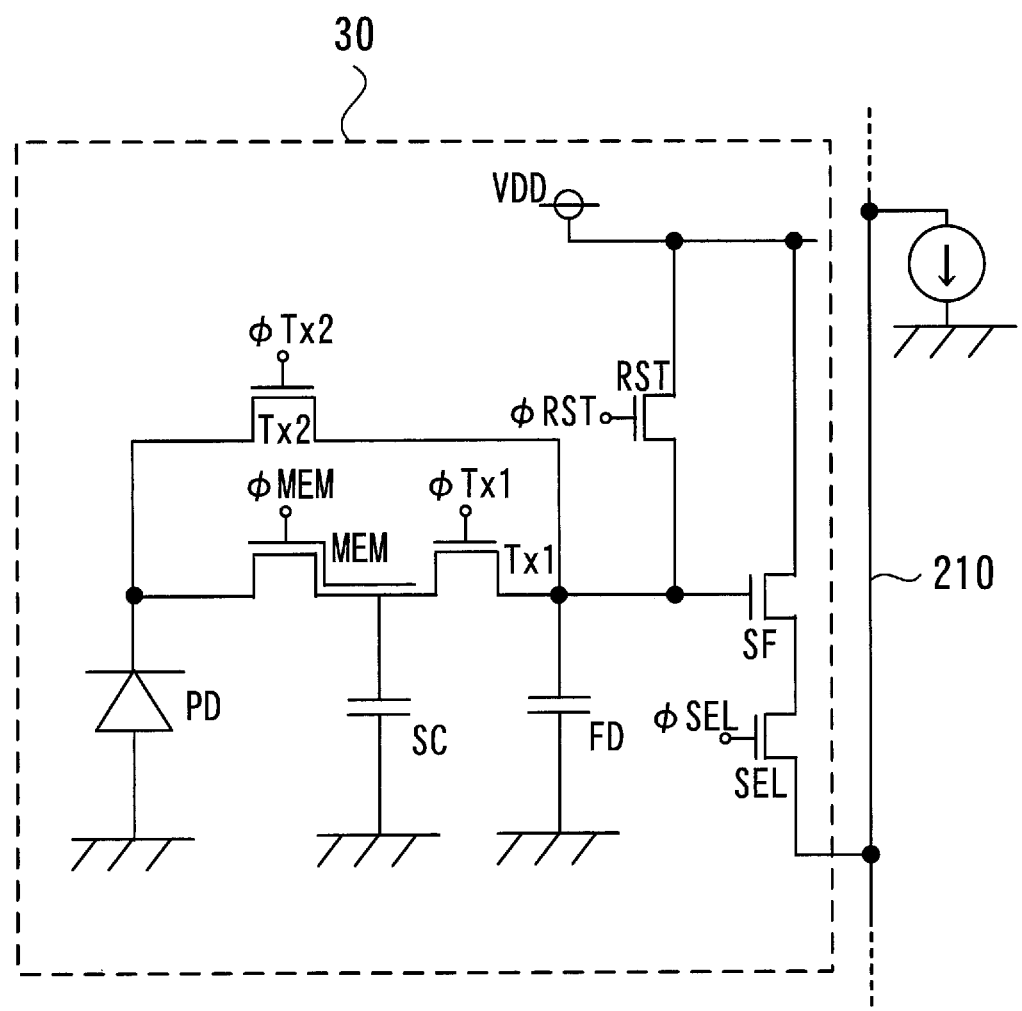
FIG. 3 is a circuit diagram illustrating a configuration of a pixel of the image sensor.

FIG. 3 is a circuit diagram illustrating a configuration of a unit pixel 30 of the image sensor 101. In FIG. 3, each pixel 30 has a photodiode PD, a diffusion capacitor SC, six transistors (a diffusion capacitance transfer transistor MEM, a first transfer transistor Tx1, a second transfer transistor Tx2, a reset transistor RST, an amplification transistor SF, and a selection transistor SEL), and a FD region. The elements of the pixel 30 are connected to one another as shown in FIG. 3. In FIG. 3, reference symbol VDD denotes a power supply voltage.

The diffusion capacitance transfer transistor MEM transfers an electric charge generated in the photodiode PD to the diffusion capacitor SC. The diffusion capacitance transfer transistor MEM is an electrode for transferring the electric charge generated in the photodiode PD to the diffusion capacitor SC. The diffusion capacitance transfer transistor MEM is turned on to transfer the electric charge when a control signal φMEM becomes its high level, and turned off when the control signal φMEM becomes its low level. The diffusion capacitor SC functions as an electric charge holding unit that holds the electric charge transferred from the photodiode PD by the diffusion capacitance transfer transistor MEM.

The first transfer transistor Tx1 transfers the electric charge held in the diffusion capacitor SC to the FD region. The first transfer transistor Tx1 is turned on to transfer the electric charge when a control signal φTx1 becomes its high level, and turned off when the control signal φTx1 becomes its low level.

The FD region converts the transferred electric charge into a voltage. The amplification transistor SF forms a source follower circuit to amplify a signal in accordance with a potential of the FD region. The reset transistor RST resets the electric charges in the FD region, the diffusion capacitor SC, and the photodiode PD. Details of the reset operation will be described later.

The selection transistor SEL is a transistor for row selection, which outputs the signal amplified by the amplification transistor SF to a corresponding vertical signal line 210. The selection transistor SEL is turned on to output the signal when a control signal φSEL becomes its high level, and turned off when the control signal φSEL becomes its low level.

The second transfer transistor Tx2 transfers the electric charge generated in the photodiode PD to the FD region. The second transfer transistor Tx2 is turned on to transfer the electric charge when a control signal φTx2 becomes its high level, and turned off when the control signal φTx2 becomes its low level.

Figure 4:
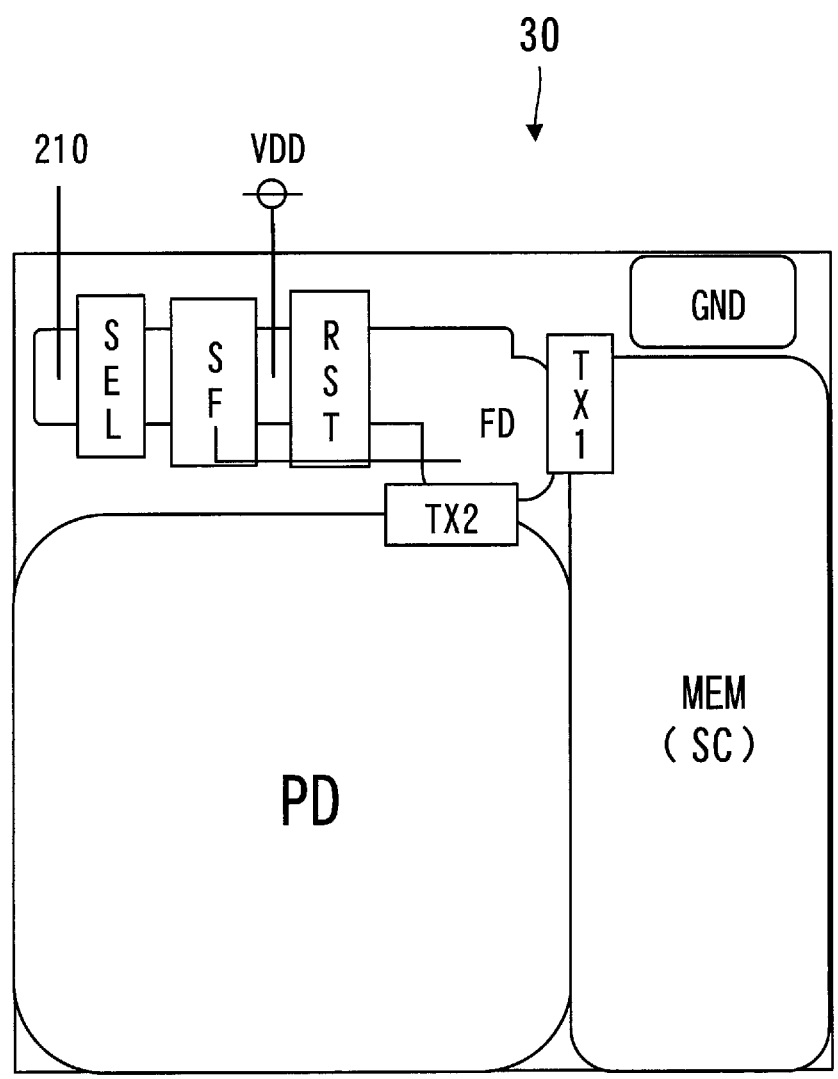
FIG. 4 is a view illustrating an arrangement of elements in the pixel.

FIG. 4 is a view illustrating an arrangement of the elements in the pixel 30. The diffusion capacitance transfer transistor MEM (diffusion capacitor SC) is arranged next to the photodiode PD. The diffusion capacitance transfer transistor MEM (diffusion capacitor SC) is shielded from light. The FD region is connected to the diffusion capacitance transfer transistor MEM (diffusion capacitor SC) via the first transfer transistor Tx1, and to the photodiode PD via the second transfer transistor Tx2.

The FD region is further connected to a control terminal of the amplification transistor SF, and to the power supply VDD via the reset transistor RST. An output terminal of the amplification transistor SF is connected to the vertical signal line 210 via the selection transistor SEL.

As described above, the image sensor 101 can perform the global shutter operation and the rolling shutter operation. Timings of the operations will be described with reference to time charts. In the following description, an accumulation time (electric charge generation time) corresponds to an exposure time determined by the body control unit 102 based on a known exposure calculation or an exposure time determined by a user operating the body operation unit 103. A time length from the start to the end of an accumulation period is the accumulation time.

Global Shutter Operation

Figure 5:
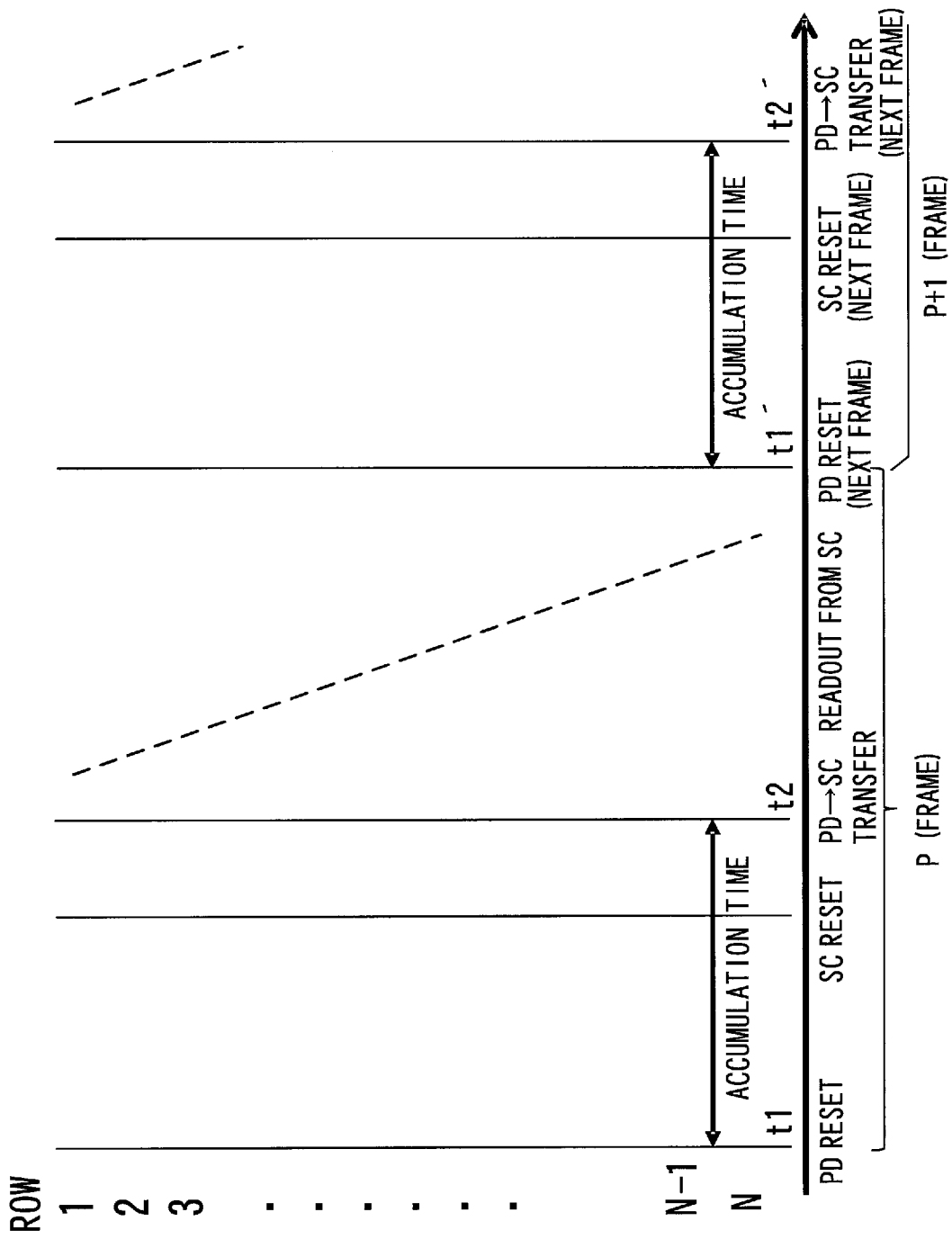
FIG. 5 is a diagram illustrating an overall timing in a global shutter operation.

FIG. 5 is a diagram illustrating an overall timing of the global shutter operation. In FIG. 5, the vertical axis represents pixel rows provided in the pixel area 201 (FIG. 2) and the horizontal axis represents time. A time length from a time point t1 at which the photodiode PD is reset in a P-th frame to a time point t2 at which the electric charge generated in the photodiode PD is transferred to the diffusion capacitor SC corresponds to the accumulation time of the P-th frame. After the electric charges is transferred from the photodiode PD to the diffusion capacitor SC, the electric charge is read out from the diffusion capacitor SC row by row. According to FIG. 5, in the global shutter operation, the accumulation time from the PD reset time point (t1) to the PD → SC transfer time point (t2) is simultaneous for every row. In a readout period, time differences occur among the rows because the readout of the electric charge from the diffusion capacitor SC is performed row by row.

A time length from a time point t1' at which the photodiode PD is reset in a (P+1)-th frame, which is the next frame, to a time point t2' at which the electric charge generated in the photodiode PD is transferred to the diffusion capacitor SC corresponds to the accumulation time of the (P+1)-th frame. After the electric charge is transferred from the photodiode PD to the diffusion capacitor SC, the electric charge is read out from the diffusion capacitor SC row by row, as in the case of the P-th frame.

Figure 6:
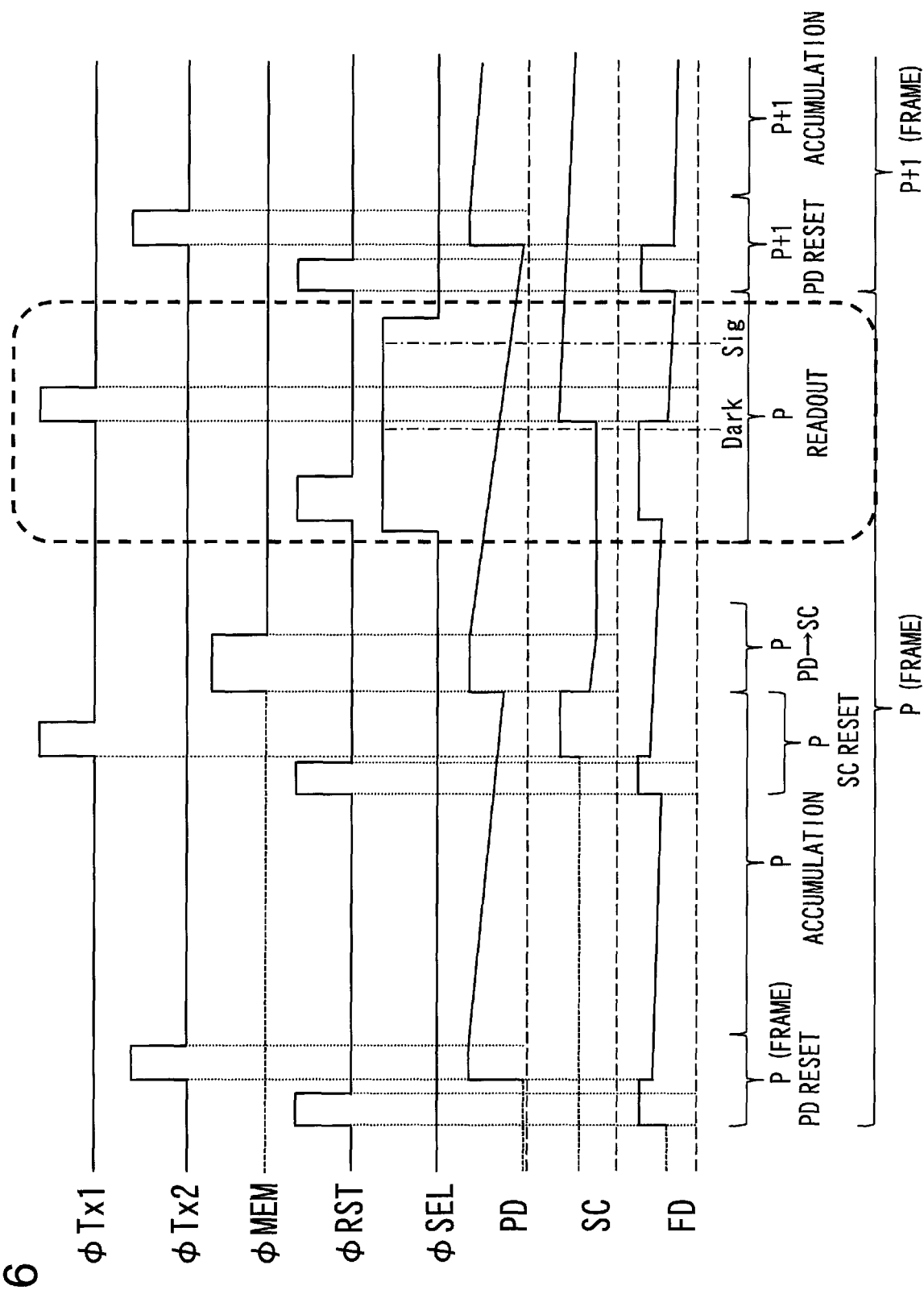
FIG. 6 is a time chart illustrating various control signals supplied to each pixel in a global shutter operation.

FIG. 6 is a time chart illustrating various control signals supplied to each pixel 30 of the image sensor 101 in the global shutter operation. One frame period includes an accumulation period and a readout period.

1. Accumulation Period

The control unit 205 causes all the pixels 30 in the pixel area 201 (FIG. 2) to simultaneously perform accumulation, and causes the photodiode PD to be reset at the start of the accumulation period.

In FIG. 6, a high-level reset pulse is supplied to the reset transistor RST as a control signal φRST in accordance with an instruction from the control unit 205. Thereby, the reset transistor RST is turned on so that a potential of the FD region is reset.

Subsequently, a high-level pulse is supplied to the second transfer transistor Tx2 as a control signal φTx2 in accordance with an instruction from the control unit 205. Thereby, the second transfer transistor Tx2 is turned on so that unnecessary electric charge existing in the photodiode PD is discharged (PD resetting).

By providing the second transfer transistor Tx2 in the image sensor 101, the photodiode PD can be reset in a shorter time than in a case where the second transfer transistor Tx2 is not provided.

The photodiode PD after the reset generates and accumulates an electric charge in accordance with an incident light amount.

During the accumulation, a high-level reset pulse is supplied to the reset transistor RST as a control signal φRST in accordance with an instruction from the control unit 205. Thereby, the reset transistor RST is turned on so that a potential of the FD region is reset. Subsequently, a high-level pulse is supplied to the first transfer transistor Tx1 as a control signal φTx1 in accordance with an instruction from the control unit 205. As a result, the first transfer transistor Tx1 is turned on so that unnecessary electric charge existing in the diffusion capacitor SC is discharged (SC resetting).

After the diffusion capacitor SC is reset, a high-level pulse is supplied to the diffusion capacitance transfer transistor MEM as a control signal φMEM in accordance with an instruction from the control unit 205. As a result, the diffusion capacitance transfer transistor MEM is turned on so that the electric charge of the photodiode PD is transferred to the diffusion capacitot SC. The accumulation period ends with electric charge transfer from the photodiode PD to the diffusion capacitor SC.

2. Readout Period

The control unit 205 sequentially reads out the electric charge row by row, from the diffusion capacitor SC of every pixel 30 in the pixel area 201 (FIG. 2). In FIG. 6, a range enclosed by a dashed line is a readout period. FIG. 6 shows only a waveform illustrating readout for one row, and the illustration of readout waveforms for other rows is omitted. However, the same readout is performed for each row.

In FIG. 6, a high-level control signal φSEL is supplied to the selection transistor SEL for a predetermined period of time in accordance with an instruction from the control unit 205. This allows the selection transistor SEL to be turned on for a predetermined period. Further, a high-level reset pulse is supplied to the reset transistor RST as a control signal φRST. Thereby, the reset transistor RST is turned on so that a potential of the FD region is reset. Then, at a time point denoted by a dashed-dotted line Dark, a reset level signal is read out by the control unit 205 via a corresponding vertical signal line 210.

Subsequently, a high-level transfer pulse is supplied to the first transfer transistor Tx1 as a control signal φTx1 in accordance with an instruction from the control unit 205. As a result, the first transfer transistor Tx1 is turned on so that the electric charge of the diffusion capacitor SC is transferred to the FD region. Then, at a time point denoted by a dashed-dotted line Sig, a signal-level signal is read out by the control unit 205 via a corresponding vertical signal line 210.

Other Operation Examples

In FIG. 5, the readout period is started only after the accumulation period for one frame ends and then the accumulation period for the next frame is started only after the readout period ends.

Figure 7:
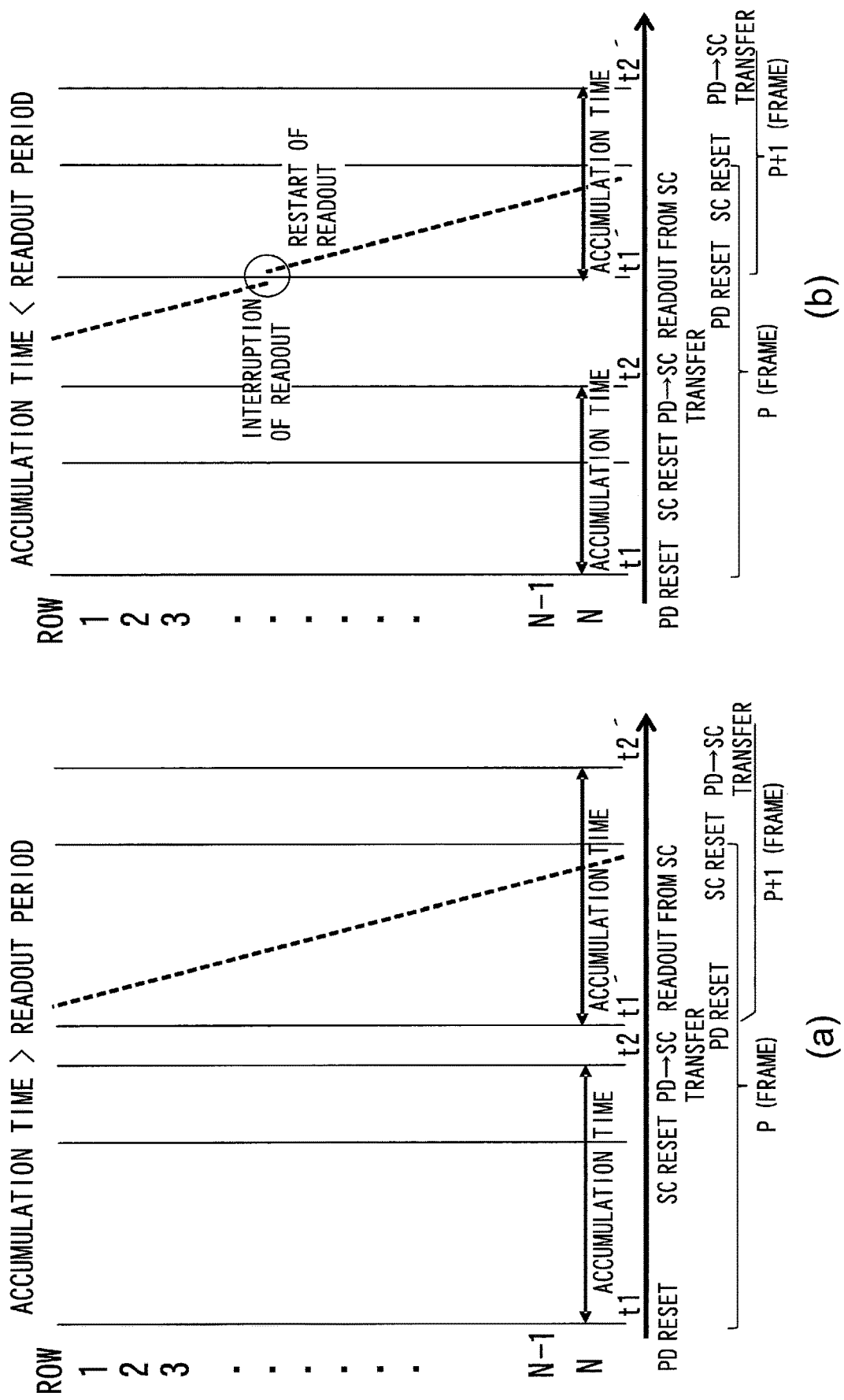
FIG. 7(a) and FIG. 7(b) are diagrams illustrating overall timings in other global shutter operations.

Instead of the way in FIG. 5, the accumulation period for the next frame may be started without waiting for the end of the signal readout period of the previous frame. FIG. 7(a) and FIG. 7(b) are diagrams illustrating overall timings in other global shutter operations. For example, when a continuous shooting mode of continuously photographing still images is set or when a moving image mode of capturing moving images is set, the global shutter operation may be performed based on the timing according to FIG. 7(a) or FIG. 7(b).

FIG. 7(a) is a diagram illustrating a case where the accumulation time is greater than the readout time. The vertical axis indicates pixel rows provided in the pixel area 201 (FIG. 2) and the horizontal axis indicates time. According to FIG. 7(a), the accumulation of the (P+1)-th frame is started at a time point t1' without waiting for the end of the signal readout period of the P-th frame. That is, the accumulation of the (P+1)-th frame and the signal readout of the P-th frame are performed in parallel. Thus, in FIG. 7(a), the signal readout period of the P-th frame is included in the accumulation period of the (P+1)-th frame.

FIG. 7(b) is a diagram illustrating a case where the accumulation time is less than the readout time. The vertical axis indicates pixel rows provided in the pixel area 201 (FIG. 2) and the horizontal axis indicates time. In FIG. 7(b), the accumulation of the (P+1)-th frame is started without waiting for the end of the readout period of the signal of the P-th frame, as in the case of FIG. 7(a). However, the accumulation of the (P+1)-th frame is started at a time point t1', at which a time elapsed since the end time point t2 of the accumulation period of the P-th frame is longer than that in FIG. 7(a), so that the signal readout period of the P-th frame ends before unnecessary electric charge existing in the diffusion capacitor SC is discharged (SC resetting) in the accumulation period of the (P+1)-th frame. That is, the start of the accumulation of the (P+1)-th frame is later than the start of the signal readout period f the P-th frame. In this case, the time point t1' is within the signal readout period of the previous frame. Thus, while discharging unnecessary electric charges existing in the photodiode PD (PD resetting) at the start of the accumulation period of the (P+1)-th frame, the signal readout of the P-th frame is temporarily interrupted and restarted after the PD resetting.

Figure 8:
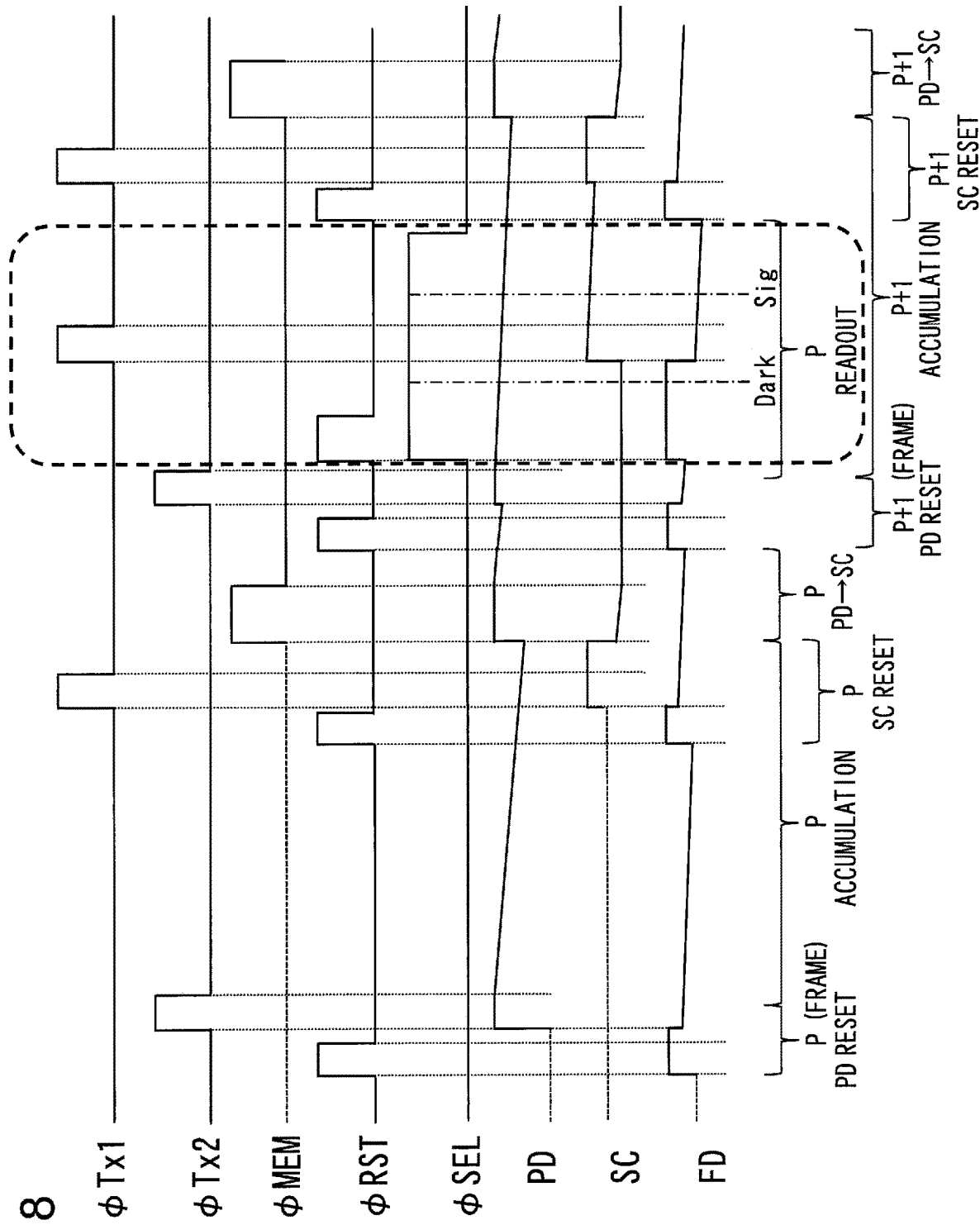
FIG. 8 is a time chart illustrating various control signals supplied to each pixel in a global electronic shutter operation.

FIG. 8 is a time chart illustrating various control signals supplied to each pixel 30 of the image sensor 101 in the global shutter operation corresponding to FIG. 7(a). As in FIG. 6, a range enclosed by a dashed line is a readout period. FIG. 8 shows only a waveform illustrating readout for one row, and the illustration of readout waveforms for other rows is omitted. However, the same readout is performed for each row.

When comparing FIG. 8 with FIG. 6, before the readout for the P-th frame is started, the accumulation of the (P+1)-th frame is started and unnecessary electric charge existing in the photodiode PD is discharged (PD resetting).

Although a time chart in the global shutter operation corresponding to FIG. 7(b) is not shown, the PD resetting of the (P+1)-th frame in FIG. 8 is performed within the readout period (in a range enclosed by a dashed line) for the P-th frame. Therefore, as described with reference to FIG. 7(b), the signal readout of the P-th frame is temporarily interrupted, and the PD reset of the (P+1)-th frame is performed during the interruption.

Rolling Shutter Operation

Figure 9:
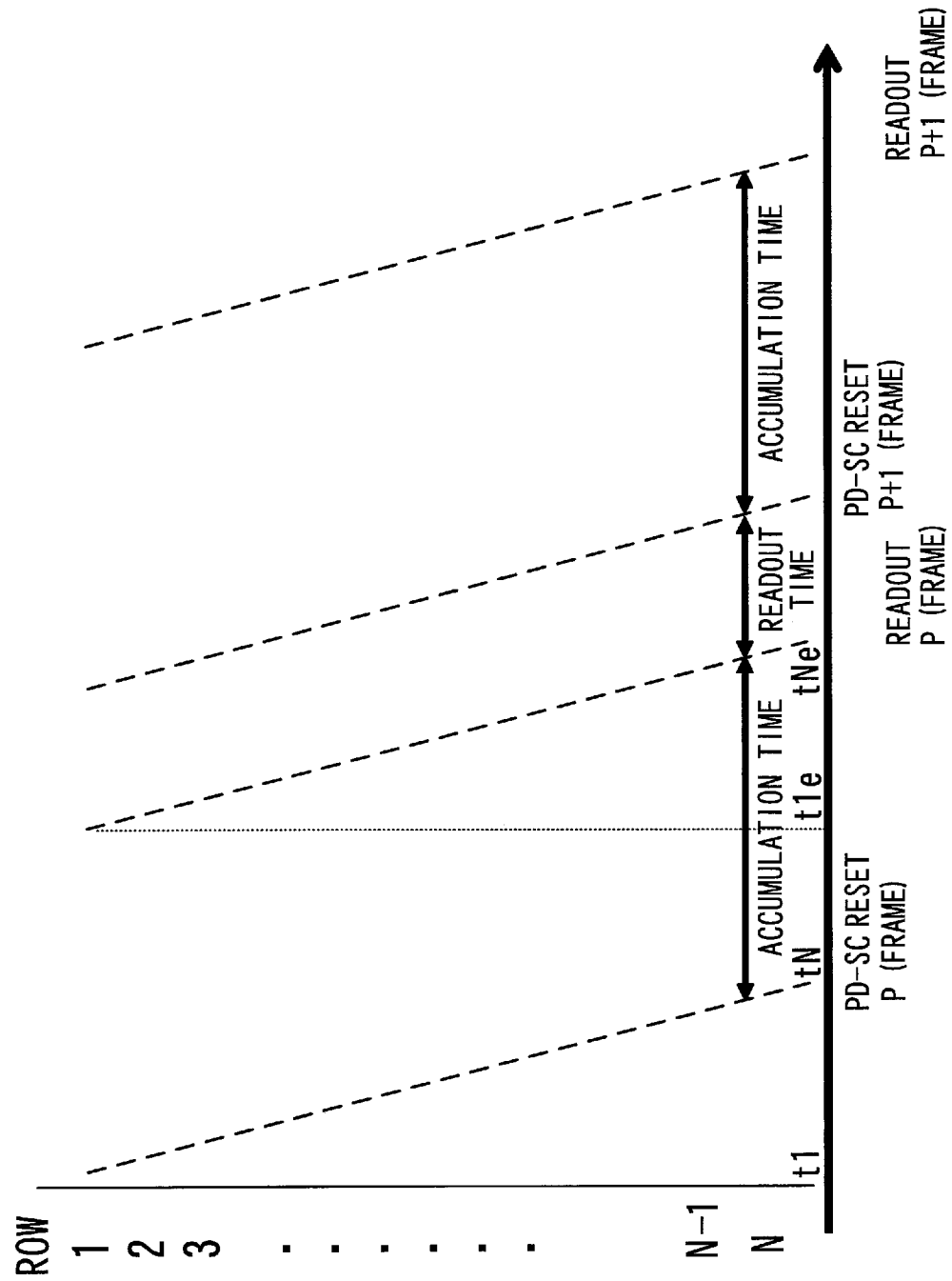
FIG. 9 is a diagram illustrating an overall timing in a rolling shutter operation.

FIG. 9 is a diagram illustrating an overall timing in a rolling shutter operation. In FIG. 9, the vertical axis represents pixel rows provided in the pixel area 201 (FIG. 2) and the horizontal axis represents time. For example, a time length from a time point t1 at which the photodiode PD is reset in a first row of the P-th frame to a time point t1e at which the electric charge generated in the photodiode PD in the first row is transferred to the FD region corresponds to the accumulation time of the first row. After the electric charge is transferred from the photodiode PD to the FD region, a signal based on the electric charge is read out. The above-described operation is performed for each row. A time length from a time point tN at which the photodiode PD is reset in a N-th row to a time point tNe at which the electric charge generated in the photodiode PD in the N-th row is transferred to the FD region corresponds to the accumulation time of the N-th row.

According to FIG. 9, in the rolling shutter operation, accumulations for the rows are not simultaneous and time differences occur among the rows, even though accumulation periods of time are the same for the first row to the N-th row. The same applies to the (P+1)-th frame, which is the next frame, and subsequent frames.

In the present embodiment, three types of rolling shutter operations are available. A first rolling operation is an operation in which, when the electric charge of the photodiode PD is saturated, an overflowed electric charge is accumulated in the diffusion capacitor SC and then the electric charge of the photodiode PD and the electric charge of the diffusion capacitor SC are simultaneously transferred to the FD region. This is suitable for a case where the FD region has an enough capacitance so that a dynamic range can be increased. Note that the capacitance of the FD region is determined when the image sensor 101 is designed.

A second rolling operation is an operation of transferring the electric charge of the photodiode PD to the diffusion capacitor SC and then transferring the electric charge from the diffusion capacitor SC to the FD region. Even if the FD region has not enough capacitance, a dynamic range can be increased.

A third rolling operation is an operation of directly transferring the electric charge of the photodiode PD to the FD region without passing through the diffusion capacitance transfer transistor MEM (diffusion capacitance SC). For any of the rolling shutter operations, the overall timing is as described in FIG. 9.

First Rolling Operation

Figure 10:
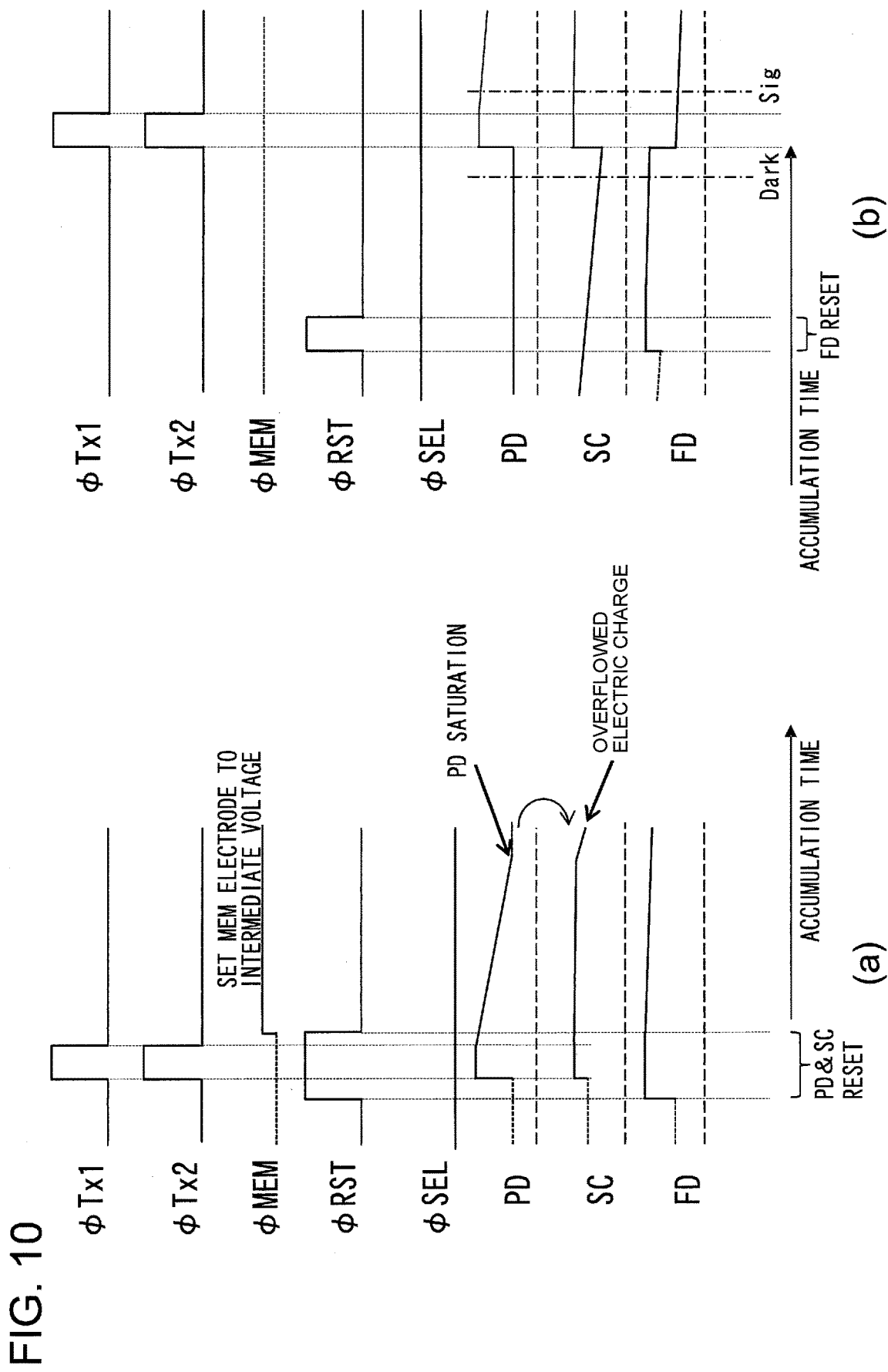
FIG. 10(a) is a time chart illustrating various control signals at the start of an accumulation period in a first rolling shutter operation.
FIG. 10(b) is a time chart illustrating various control signals at a time of shifting from the accumulation period to a readout.

FIG. 10(a) and FIG. 10(b) are time charts illustrating various control signals supplied to each pixel 30 of the image sensor 101 in the first rolling shutter operation. FIG. 10(a) is a time chart illustrating various control signals at the start of the accumulation period, and FIG. 10(b) is a time chart illustrating various control signals at a time of shifting from the accumulation period to a readout.

In FIG. 10(a), the control unit 205 sequentially performs accumulation for the pixel rows in the pixel area 201 (FIG. 2), and resets the photodiode PD and the diffusion capacitor SC at the start of the accumulation period. Specifically, a high-level reset pulse is supplied to the reset transistor RST as a control signal φRST in accordance with an instruction from the control unit 205. Thereby, the reset transistor RST is turned on so that a potential of the FD region is reset.

Subsequently, high-level pulses are supplied to the first transfer transistor Tx1 and the second transfer transistor Tx2 as a control signal φTx1 and a control signal φTx2, respectively, in accordance with an instruction from the control unit 205. When the high-level pulse is supplied to the second transfer transistor Tx2, the second transfer transistor Tx2 is turned on so that unnecessary electric charge existing in the photodiode PD is discharged (PD resetting). Further, a high-level pulse is supplied to the first transfer transistor Tx1, and thus the first transfer transistor Tx1 is turned on so that unnecessary electric charge existing in the diffusion capacitor SC is discharged (SC resetting).

Further, in accordance with an instruction from the control unit 205, a control signal φMEM is controlled so that a voltage of the electrode of the diffusion capacitance transfer transistor MEM is set to an intermediate voltage. Setting the voltage of the electrode of the diffusion capacitance transfer transistor MEM to the intermediate voltage is intended for the electric charge to overflow from the photodiode PD into the diffusion capacitor SC. That is, the photodiode PD after the reset generates and accumulates an electric charge in accordance with an incident light amount and then, when the photodiode PD is saturated and the electric charge overflows, the overflowed electric charge is accumulated in the diffusion capacitor SC. A dynamic range can be increased because electric charges are accumulated in the photodiode PD and the diffusion capacitor SC.

In FIG. 10(b), the control unit 205 resets the FD region at the end of the accumulation period. Specifically, a high-level reset pulse is supplied to the reset transistor RST as a control signal φRST in accordance with an instruction from the control unit 205. Thereby, the reset transistor RST is turned on so that a potential of the FD region is reset. Then, at a time point denoted by a dashed-dotted line Dark, the reset level signal is read out by the control unit 205 via a corresponding vertical signal line 210.

In the first rolling shutter operation, the generated electric charges are transferred from the photodiode PD and the diffusion capacitor SC to the FD region at one time. Specifically, high-level pulses are supplied to the first transfer transistor Tx1 and the second transfer transistor Tx2 as a control signal φTx1 and a control signal φTx2, respectively, in accordance with an instruction from the control unit 205. As a result, the first transfer transistor Tx1 is turned on so that the electric charge accumulated in the diffusion capacitor SC is transferred to the FD region. In parallel thereto, the second transfer transistor Tx2 is turned on so that the electric charge accumulated in the photodiode PD is transferred to the FD region. The accumulation period ends with electric charge transfer to the FD region. Then, at a time point denoted by a dashed-dotted line Sig, the signal level signal is read out by the control unit 205 via a corresponding vertical signal line 210.

Second Rolling Operation

Figure 11:
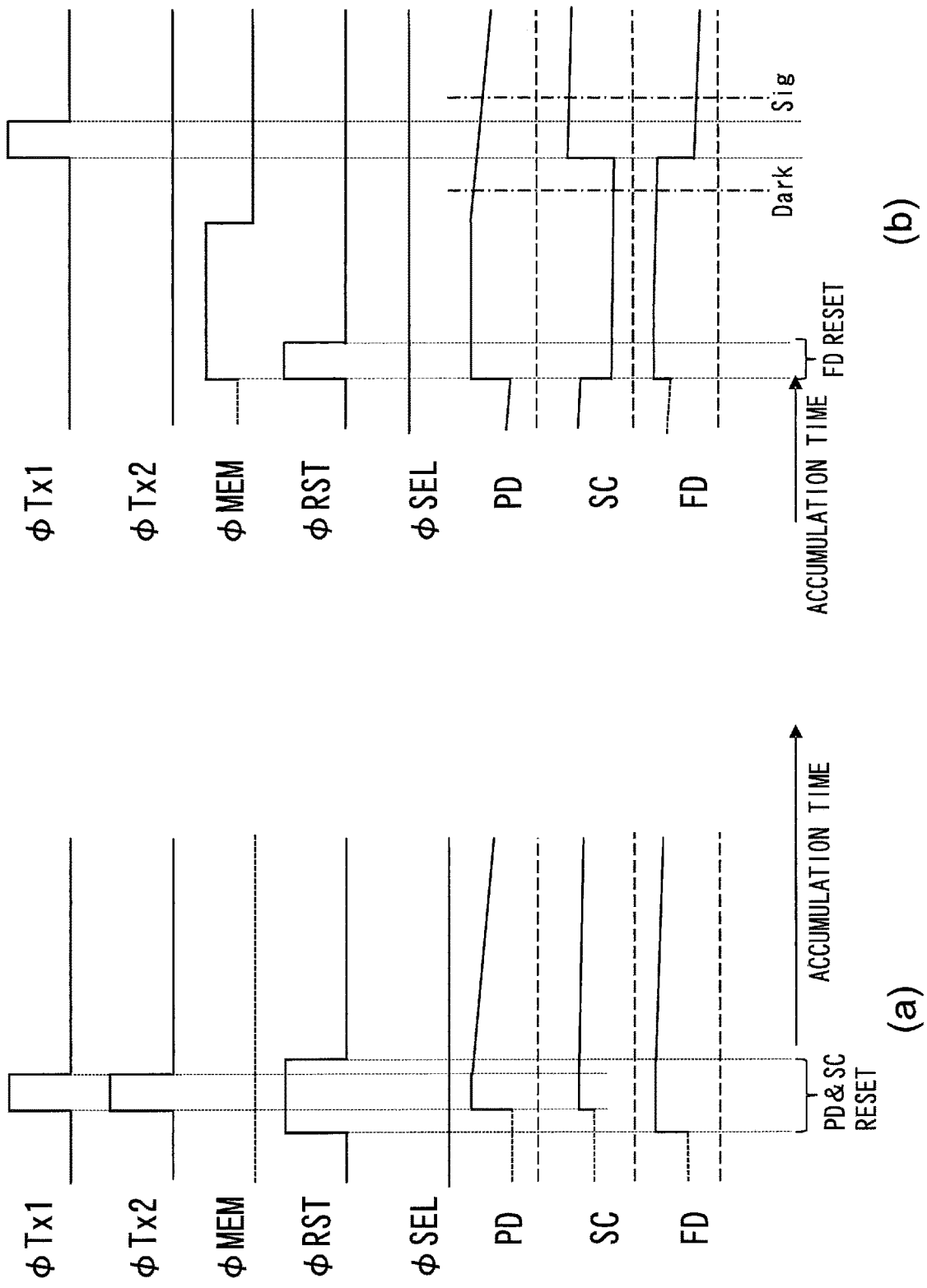
FIG. 11(a) is a time chart illustrating various control signals at the start of an accumulation period in a second rolling shutter operation.
FIG. 11(b) is a time chart illustrating various control signals at a time of shifting from the accumulation period to a readout.

FIG. 11(a) and FIG. 11(b) are time charts illustrating various control signals supplied to each pixel 30 of the image sensor 101 in the second rolling shutter operation. FIG. 11(a) is a time chart illustrating various control signals at the start of the accumulation period, and FIG. 11(b) is a time chart illustrating various control signals at a time of shifting from the accumulation period to a readout.

In FIG. 11(a), the control unit 205 sequentially performs accumulation for the pixel rows in the pixel area 201 (FIG. 2), and resets the photodiode PD and the diffusion capacitor SC at the start of the accumulation period. Waveforms of the control signal φRST and the control signals φTx1 and φTx2 are the same as those in the case of FIG. 10(a). FIG. 11(a) is different from FIG. 10(a) in that the voltage of the electrode of the diffusion capacitance transfer transistor MEM is not set to an intermediate voltage. With this configuration, the electric charge does not overflow to the diffusion capacitor SC, even when the photodiode PD, which generates and accumulates an electric charge in accordance with an incident light amount after the reset, is saturated.

In FIG. 11(b), the control unit 205 resets the FD region at the end of the accumulation period. A waveform of the control signal φRST is the same as that in the case of FIG. 10(b). At a time point denoted by a dashed-dotted line Dark, the reset level signal is read out by the control unit 205 via a corresponding vertical signal line 210.

In the second rolling shutter operation, the generated electric charge is transferred from the photodiode PD to the diffusion capacitor SC, and further from the diffusion capacitor SC to the FD region in a relay form. Thus, differences from FIG. 10(b) are in that the diffusion capacitance transfer transistor MEM is turned on before the first transfer transistor Tx1 is turned on and that the second transfer transistor Tx2 is not turned on.

When a high-level pulse is supplied to the diffusion capacitance transfer transistor MEM as a control signal φMEM in accordance with an instruction from the control unit 205, the diffusion capacitance transfer transistor MEM is turned on so that the electric charge accumulated in the photodiode PD is transferred to the diffusion capacitor SC. The accumulation period ends with electric charge transfer from the photodiode PD to the diffusion capacitor SC. Thereafter, when a high-level transfer pulse is supplied to the first transfer transistor Tx1 as a control signal φTx1, the first transfer transistor Tx1 is turned on so that the electric charge accumulated in the diffusion capacitor SC is transferred to the FD region. Then, at a time point denoted by a dashed-dotted line Sig, the signal level signal is read out by the control unit 205 via a corresponding vertical signal line 210.

Third Rolling Operation

Figure 12:
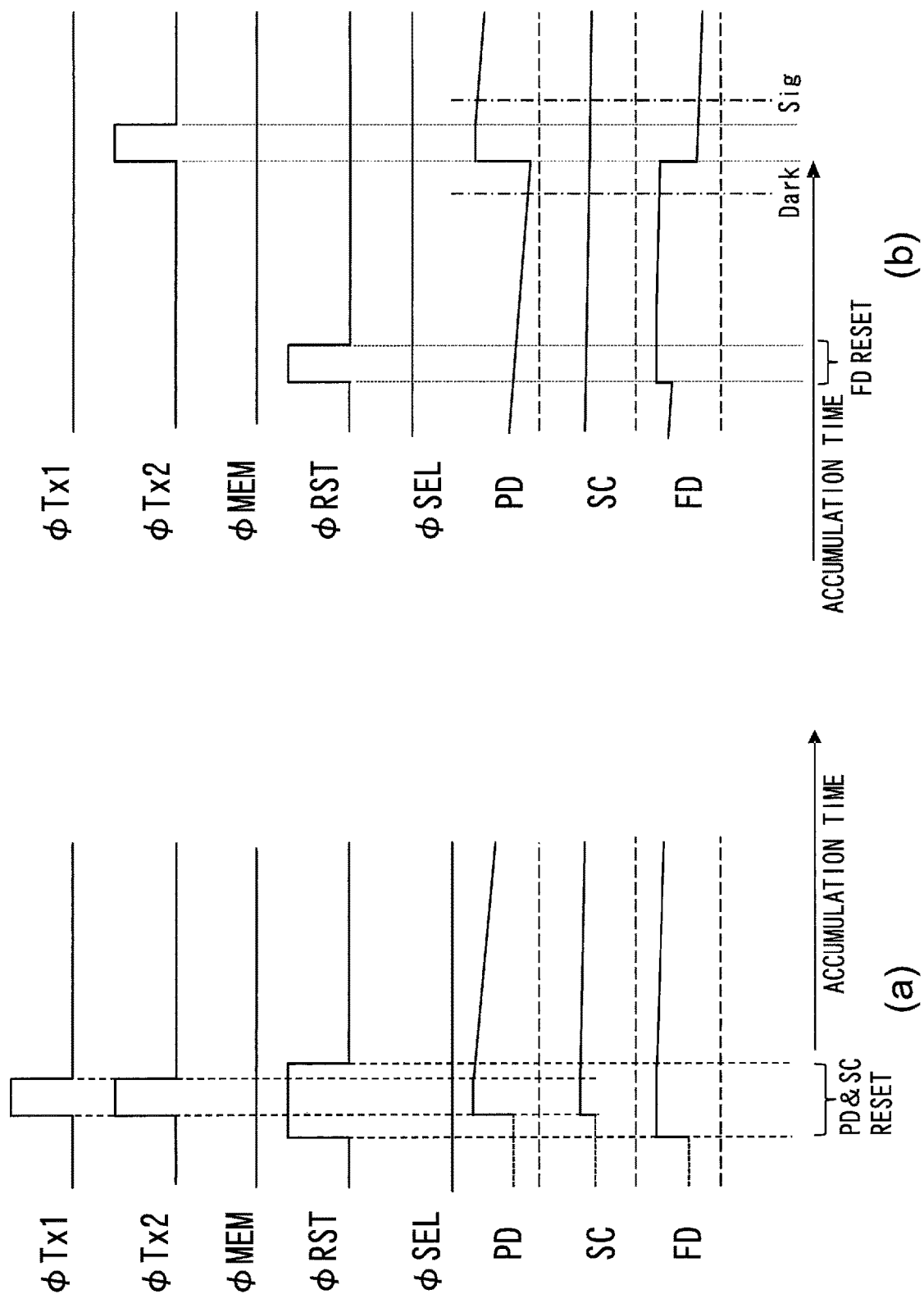
FIG. 12(a) is a time chart illustrating various control signals at the start of an accumulation period in a third rolling shutter operation.
FIG. 12(b) is a time chart illustrating various control signals at a time of shifting from the accumulation period to a readout.

FIG. 12(a) and FIG. 12(b) are time charts illustrating various control signals supplied to each pixel 30 of the image sensor 101 in the third rolling shutter operation. FIG. 12(a) is a time chart illustrating various control signals at the start of the accumulation period, and FIG. 12(b) is a time chart illustrating various control signals at a time of shifting from the accumulation period to a readout.

In FIG. 12(a), the control unit 205 sequentially performs accumulation for the pixel rows in the pixel area 201 (FIG. 2), and resets the photodiode PD and the diffusion capacitor SC at the start of the accumulation period. Waveforms of the control signal φRST and the control signals φTx1 and φTx2 are the same as those in the case of FIG. 11(a).

In FIG. 12(b), the control unit 205 resets the FD region at the end of the accumulation period. A waveform of the control signal φRST is the same as that in the case of FIG. 11(b). At a time point denoted by a dashed-dotted line Dark, the reset level signal is read out by the control unit 205 via a corresponding vertical signal line 210.

In the third rolling shutter operation, the generated electric charge is directly transferred from the photodiode PD to the FD region without using the diffusion capacitance transfer transistor MEM (diffusion capacitor SC). Thus, differences from FIG. 11(b) are in that the first transfer transistor Tx1 and the diffusion capacitance transfer transistor MEM are not turned on and that the second transfer transistor Tx2 is turned on.

When a high-level transfer pulse is supplied to the second transfer transistor Tx2 as a control signal φTx2 in accordance with an instruction from the control unit 205, the second transfer transistor Tx2 is turned on so that the electric charge accumulated in the photodiode PD is transferred to the FD region. The accumulation period ends with electric charge transfer from the photodiode PD to the FD region. Then, at a time point denoted by a dashed-dotted line Sig, the signal level signal is read out by the control unit 205 via a corresponding vertical signal line 210.

The body control unit 102 determines whether the above-described image sensor 101 is to perform the global shutter operation or the rolling shutter operation depending on an established mode. For example, the body control unit 102 causes the image sensor 101 to perform the global shutter operation when a single shooting mode is set for photographing a still image at a time of depression of a shutter button, or a continuous shooting mode is set for continuously photographing still images during depression of the shutter button. This is because a so-called rolling shutter distortion (a moving subject looks distorted in an image) is more noticeable when the rolling shutter operation is performed in photographing still images.

On the other hand, when the moving image mode is set, the body control unit 102 causes the image sensor 101 to perform the rolling shutter operation.

Note that the body control unit 102 may cause the image sensor 101 to perform the global shutter operation, even when the moving image mode of photographing moving images is set.

For example, when the body control unit 102 is set to a wide dynamic range (HDR) mode in which subjects, from a high-luminance subject to a low-luminance subject, are photographed with rich gradations, the body control unit 102 causes the image sensor 101 to perform the first rolling shutter operation or the second rolling shutter operation. The first rolling shutter operation and the second rolling shutter operation may be appropriately selected.

According to the Above-Described Embodiment, the Following Operational Advantages can be achieved.

(1) Each of a plurality of pixels 30 included in an image sensor 101 includes: a photodiode PD that performs photoelectric conversion of light to generate an electric charge; an FD region that accumulates the electric charge generated in the photodiode PD; a diffusion capacitor SC that holds the electric charge generated in the photodiode PD; a first transfer path (second transfer transistor Tx2) that transfers the electric charge from the photodiode PD to the FD region; and a second transfer path (first transfer transistor Tx1) that transfers the electric charge from the photodiode PD to the FD region via the diffusion capacitor SC. With this configuration, the electric charge generated in the photodiode PD can be transferred from the photodiode PD to the FD region via two transfer routes. This allows the global shutter operation or the rolling shutter operation to be appropriately performed, for example.

(2) Because the first transfer path (the second transfer transistor Tx2) of the image sensor 101 also serves as a path of discharging the electric charge from the photodiode PD, the electric charge can be discharged (reset) from the photodiode PD in a shorter time than in a case where the image sensor 101 has only the second transfer path that transfers the electric charge from the photodiode PD to the FD region via the diffusion capacitor SC.

(3) The plurality of pixels 30 of the image sensor 101 are arranged in a row direction and a column direction, and controlled to perform a global shutter operation in which the electric charges are discharged simultaneously in the plurality of rows, or a rolling shutter operation in which the electric charges are discharged row by row in the plurality of rows, so that the two electronic shutter operations can be appropriately performed.

(4) In a case where the image sensor 101 performs the global shutter operation, when the second transfer path (the first transfer transistor Tx1) is selected, the electric charges generated in the photodiodes PD are simultaneously transferred to the diffusion capacitors SC in the pixels 30 in a plurality of rows and then the electric charges transferred to the diffusion capacitors SC are transferred to the FD regions row by row. With this configuration, the global shutter operation can be appropriately performed.

(5) In a case where the image sensor 101 performs the global shutter operation, when the electric charge generated in the photodiode PD is transferred to the diffusion capacitor SC in each of the pixels 30 in the plurality of rows, the electric charge is discharged in the pixels 30 in the plurality of rows before starting transfer from the diffusion capacitor SC to the FD region. Therefore, a photoelectric conversion for the next frame can be started earlier.

(6) In a case where the image sensor 101 performs the first rolling shutter operation, in the pixels 30 in the plurality of rows, when the first transfer path (the second transfer transistor Tx2) and the second transfer path (the first transfer transistor Tx2) are selected, the electric charge generated in the photodiode PD is transferred to the FD region through the first transfer path, and then to the FD region accumulation unit through the second transfer path via the diffusion capacitor SC, for each row. With this configuration, in the first rolling shutter operation, the electric charge can be efficiently transferred in parallel via two routes.

(7) In performing the first rolling shutter operation, the diffusion capacitor SC of the image sensor 101 is configured to hold an electric charge overflowing from the photodiode PD, so that a dynamic range can be increased compared with a case where the electric charge overflowing from the photodiode PD is wastefully discarded.

(8) In a case where the image sensor 101 performs the second rolling shutter operation, when the second transfer path (the first transfer transistor Tx1) is selected, the electric charge generated in the photodiode PD of each of the plurality of pixels 30 is transferred to the diffusion capacitor SC row by row, and then the electric charge transferred to the diffusion capacitor SC is transferred to the FD region. With this configuration, a dynamic range can be increased as compared with a case where the transfer is performed without passing through the diffusion capacitor SC.

(9) In a case where the image sensor 101 performs the third rolling shutter operation, when the first transfer path (the second transfer transistor Tx2) is selected, the electric charge generated in the photodiode PD of each of the plurality of pixels 30 is transferred to the FD region row by row. With this configuration, the rolling shutter operation can be performed in a mode different from the above (6) to (8).

In the above description, an example has been described in which the image sensor 101 is mounted in a digital camera. However, the image sensor 101 may be mounted in an electronic device other than the digital camera, such as a smartphone, a tablet terminal, or a wearable terminal.

The present invention is not limited to the above-described embodiment. Other embodiments that can be contemplated within the scope of the technical concept of the present invention are also included in the scope of the present invention.

The disclosure of the following priority application is herein incorporated by reference:

Japanese Patent Application No. 2017-192167 (filed on Sep. 29, 2017)

REFERENCE SIGNS LIST

30 . . . pixel
100 . . . camera body
101 . . . image sensor
102 . . . body control unit
201 . . . pixel area
202 . . . vertical control unit
203 . . . horizontal control unit
204 . . . output unit
205 . . . control unit
210 . . . vertical signal line
MEM . . . diffusion capacitance transfer transistor
PD . . . photodiode
SC . . . diffusion capacitor
SF . . . amplification transistor
Tx1 . . . first transfer transistor
Tx2 . . . second transfer transistor

The invention claimed is:

1. An image sensor comprising
a plurality of pixels arranged in a first direction and in a second direction intersecting the first direction, each pixel of the plurality of pixels comprising:
a photoelectric conversion unit that photoelectrically converts light to generate an electric charge;
a holding unit that holds the electric charge generated by the photoelectric conversion unit;
an accumulation unit that accumulates the electric charge generated by the photoelectric conversion unit;
a first transfer path (i) that transfers the electric charge generated by the photoelectric conversion unit to the accumulation unit and (ii) that serves as a path that discharges the electric charge from the photoelectric conversion unit in first and third controls; and
a second transfer path (i) that transfers the electric charge generated by the photoelectric conversion unit to the accumulation unit via the holding unit and (ii) that serves as a path that discharges the electric charge from the photoelectric conversion unit in a second control; and
a controller configured to:
execute the first control for causing pixels of the plurality of pixels arranged in the first direction to transfer the electric charges from the photoelectric conversion units to the accumulation units by the first transfer paths;
execute the second control for causing the pixels arranged in the first direction to transfer the electric charges from the photoelectric conversion units to the accumulation units by the second transfer paths; and
execute the third control for causing the pixels arranged in the first direction and pixels of the plurality of pixels arranged in the second direction to transfer the electric charges from the photoelectric conversion units to the holding units by the second transfer paths.

2. The image sensor according to claim 1, wherein:
in the first control, the first transfer paths of the pixels arranged in the first direction discharge the electric charges from the photoelectric conversion units;
in the second control, the second transfer paths of the pixels arranged in the first direction discharge the electric charges from the photoelectric conversion units; and
in the third control, the first transfer paths of the pixels arranged in the first and second directions discharge the electric charges from the photoelectric conversion units.

3. The image sensor according to claim 1, wherein when the controller performs the third control,
(i) the second transfer path transfers the electric charge generated by the photoelectric conversion unit to the holding unit in each of the pixels arranged in the first and second directions, and
(ii) the second transfer path transfers the electric charge transferred to the holding unit to the accumulation unit in each of a set of the pixels arranged in the first direction.

4. The image sensor according to claim 1, wherein when the electric charge generated by the photoelectric conversion unit is transferred to the holding unit in each of a set of the pixels arranged in the first direction, the electric charge is discharged in each of the set of pixels before the transfer of the electric charge from the holding unit to the accumulation unit is started.

5. The image sensor according to claim 1, wherein:
when the controller performs the first control, the first transfer path transfers the electric charge generated by the photoelectric conversion unit to the accumulation unit for each of a set of the pixels arranged in the first direction, and
when the controller performs the second control, the second transfer path transfers the electric charge generated by the photoelectric conversion unit to the accumulation unit via the holding unit for each of the set of pixels.

6. The image sensor according to claim 1, wherein in the second control, the holding unit holds an electric charge overflowing from the photoelectric conversion unit.

7. The image sensor according to claim 1, wherein when the controller performs the second control,
the second transfer path transfers the electric charge generated by the photoelectric conversion unit of each of a set of the pixels arranged in the first direction to the holding unit and transfers to the accumulation unit the electric charge transferred to the holding unit.

8. The image sensor according to claim 1, wherein the accumulation unit of each of the plurality of pixels is a diffusion layer.

9. The image sensor according to claim 1, wherein the first control is a rolling shutter mode, and the third control is a global electronic shutter mode.

10. The image sensor according to claim 1, wherein:
in the first control, the electric charges are transferred from the photoelectric conversion units to the accumulation units simultaneously by the first transfer paths of the pixels arranged in the first direction;
in the second control, the electric charges are transferred from the photoelectric conversion units to the accumulation units simultaneously by the second transfer paths of the pixels arranged in the first direction; and
in the third control, the electric charges are transferred from the photoelectric conversion units to the accumulation units simultaneously by the second transfer paths of the pixels arranged in the first and second directions.

11. The image sensor according to claim 1, further comprising
a generation unit that generates image data based on a signal output from the image sensor.

12. An image sensor comprising
a plurality of pixels arranged in a first direction and in a second direction intersecting the first direction, each pixel of the plurality of pixels comprising:
a photoelectric conversion unit that photoelectrically converts light to generate an electric charge;
a holding unit that holds the electric charge generated by the photoelectric conversion unit;
an accumulation unit that accumulates the electric charge generated by the photoelectric conversion unit;
a first transfer path that transfers the electric charge generated by the photoelectric conversion unit to the accumulation unit; and
a second transfer path that transfers the electric charge generated by the photoelectric conversion unit to the accumulation unit via the holding unit; and
a controller configured to:
execute a first control for causing pixels of the plurality of pixels arranged in the first direction to transfer the electric charges from the photoelectric conversion units to the accumulation units by the first transfer paths;
execute a second control for causing the pixels arranged in the first direction to transfer the electric charges from the photoelectric conversion units to the accumulation units by the second transfer paths; and
execute a third control for causing the pixels arranged in the first direction and pixels of the plurality of pixels arranged in the second direction to transfer the electric charges from the photoelectric conversion units to the holding units by the second transfer paths, wherein:
the third control is a global electronic shutter mode, and
the first control is a rolling shutter mode.

13. The image sensor according to claim 12, wherein
when the controller performs the third control,
(i) the second transfer path transfers the electric charge generated by the photoelectric conversion unit to the holding unit in each of the pixels arranged in the first and second directions, and
(ii) the second transfer path transfers the electric charge transferred to the holding unit to the accumulation unit in each of a set of the pixels arranged in the first direction.

14. The image sensor according to claim 12, wherein
when the electric charge generated by the photoelectric conversion unit is transferred to the holding unit in each of a set of the pixels arranged in the first direction, the electric charge is discharged in each of the set of pixels before the transfer of the electric charge from the holding unit to the accumulation unit is started.

15. The image sensor according to claim 12, wherein:
when the controller performs the first control, the first transfer path transfers the electric charge generated by the photoelectric conversion unit to the accumulation unit for each of a set of the pixels arranged in the first direction, and
when the controller performs the second control, the second transfer path transfers the electric charge generated by the photoelectric conversion unit to the accumulation unit via the holding unit for each of the set of pixels.

16. The image sensor according to claim 12, wherein
in the second control, the holding unit holds an electric charge overflowing from the photoelectric conversion unit.

17. The image sensor according to claim 12, wherein
when the controller performs the second control,
the second transfer path transfers the electric charge generated by the photoelectric conversion unit of each of a set of the pixels arranged in the first direction to the holding unit and transfers to the accumulation unit the electric charge transferred to the holding unit.

18. The image sensor according to claim 12, wherein:
in the first control, the electric charges are transferred from the photoelectric conversion units to the accumulation units simultaneously by the first transfer paths of the pixels arranged in the first direction;
in the second control, the electric charges are transferred from the photoelectric conversion units to the accumulation units simultaneously by the second transfer paths of the pixels arranged in the first direction; and
in the third control, the electric charges are transferred from the photoelectric conversion units to the accumulation units simultaneously by the second transfer paths of the pixels arranged in the first and second directions.

19. An image device comprising:
the image sensor according to claim 12; and
a generation unit that generates image data based on a signal output from the image sensor.

* * * * *